US012739987B2

(12) United States Patent
Huang et al.

(10) Patent No.: US 12,739,987 B2
(45) Date of Patent: Sep. 15, 2026

(54) FOLDABLE ELECTRONIC DEVICE

(71) Applicant: Acer Incorporated, New Taipei City (TW)

(72) Inventors: Yi-Ta Huang, New Taipei City (TW); Wu-Chen Lee, New Taipei City (TW)

(73) Assignee: Acer Incorporated, New Tapei City (TW)

(*) Notice: Subject to any disclaimer, the term of this patent is extended or adjusted under 35 U.S.C. 154(b) by 108 days.

(21) Appl. No.: 18/786,549

(22) Filed: Jul. 28, 2024

(65) Prior Publication Data

US 2025/0169000 A1 May 22, 2025

(30) Foreign Application Priority Data

Nov. 20, 2023 (TW) ................................ 112144755

(51) Int. Cl.
*H05K 5/00* (2025.01)
*F16C 11/04* (2006.01)
*H05K 5/02* (2006.01)

(52) U.S. Cl.
CPC ............ *H05K 5/0226* (2013.01); *F16C 11/04* (2013.01)

(58) Field of Classification Search
CPC .............................. F16C 11/04; H05K 5/0226
See application file for complete search history.

(56) References Cited

U.S. PATENT DOCUMENTS 5,142,739 A * 9/1992 Lin ..................... E05D 11/1007 16/326
6,886,221 B2 * 5/2005 Minami .............. H04M 1/0216 361/679.01
6,918,159 B2 * 7/2005 Choi ..................... G06F 1/1681 16/337
7,082,642 B2 * 8/2006 Su ......................... G06F 1/1681 16/338
7,334,295 B2 * 2/2008 Chou .................... G06F 1/1681 16/327
9,429,993 B2 * 8/2016 Thomas ................ G06F 1/1632
(Continued)

FOREIGN PATENT DOCUMENTS

TW 419002 1/2001
TW M291190 5/2006

*Primary Examiner* — Imani N Hayman
*Assistant Examiner* — Rashen E Morrison
(74) *Attorney, Agent, or Firm* — JCIPRNET

(57) ABSTRACT

A foldable electronic device including a first body, a second body, and a hinge module is provided. The hinge module connects the first body and the second body along a pivoting axis such that the first body and the second body relatively rotate to each other to be folded or unfolded via the hinge module. The hinge module includes a latch disposed in the second body, a shaft member positioned in the latch, a torsion member disposed in the first body to move along with the first body and pivotally connected to the shaft member, and a screw member penetrating through a side surface of the second body from outside the second body and extending inside the second body to lock the latch and the shaft member together. A friction force generated by a relative pivoting of the torsion member and the shaft member forms a torsion force of the hinge module. Part of the screw member is exposed on the side surface of the second body.

12 Claims, 9 Drawing Sheets

(56) References Cited

U.S. PATENT DOCUMENTS

| | | | | |
|---|---|---|---|---|
| 11,782,487 | B2 * | 10/2023 | Shen | G06F 1/1681 361/679.27 |
| 2005/0189196 | A1 * | 9/2005 | Chou | G06F 1/1616 198/300 |
| 2006/0232926 | A1 * | 10/2006 | Homer | E05B 73/0082 361/679.43 |
| 2021/0216110 | A1 * | 7/2021 | Hsu | G06F 1/1681 |
| 2022/0259908 | A1 * | 8/2022 | Gorontzi | E05D 7/1044 |
| 2023/0036589 | A1 * | 2/2023 | Brewster | E05D 7/1044 |
| 2023/0266801 | A1 * | 8/2023 | Shen | G06F 1/1681 361/679.27 |

* cited by examiner

FOLDABLE ELECTRONIC DEVICE

CROSS-REFERENCE TO RELATED APPLICATION

This application claims the priority benefit of Taiwan application serial no. 112144755, filed on Nov. 20, 2023. The entirety of the above-mentioned patent application is hereby incorporated by reference herein and made a part of this specification.

BACKGROUND

Technical Field

The disclosure relates to an electronic device, and in particular to a foldable electronic device.

Description of Related Art

ESG is an abbreviation of three English words, namely environmental protection (Environment), social responsibility (Social), and corporate governance (Governance). The concept of ESG was first proposed by the UN Global Compact in 2004 and is regarded as an indicator for evaluating operations of an enterprise. ESG is a measure of sustainable development indicators of an enterprise, which are the carbon reduction and sustainable development goals required by international and domestic governments. In the past, business operations only needed to focus on financial data. However, despite the presence of a stunning financial report, the international goal of promoting earth sustainability is violated when business operations violate human rights, discharge wastewater, infringe on consumer rights, and harm the living environment of the earth's creatures, which would prompt institutional investors to reduce investment and cooperation in such an enterprise and also affect the reputation of the enterprise. Today, enterprises that value the ESG concept not only have transparent financial reports, but also stable, low-risk operating models and a relatively stable long-term performance. For the above reasons, for the electronics manufacturing industry, whether the products it manufactures can meet the above conditions has become one of the evaluation conditions for the product.

Taking notebook computers or similar foldable electronic devices as an example, the evaluation content depends on the amount of energy consumed in the manufacturing process of the product, and whether the product has the capability to be repaired (regenerated). In order to achieve the above goals, the component design and assembly configuration of the foldable electronic devices require corresponding new technologies and measures.

Especially in terms of the assembly and component configuration, existing foldable electronic devices mostly use screws, welding, etc. to combine and fix the structural parts such that it creates considerable obstacles to subsequent maintenance and disassembly, which in turn leads to doubts about the repair (regeneration) capability of the foldable electronic devices and makes it difficult to meet the aforementioned sustainability goals.

SUMMARY

The disclosure provides a foldable electronic device, which allows two bodies pivotally connected to each other to be smoothly disassembled and assembled through a latch structure exposed outside the body.

A foldable electronic device of the disclosure includes a first body, a second body, and a hinge module. The hinge module connects the first body and the second body along a pivoting axis such that the first body and the second body relatively rotate to each other to be folded or unfolded via the hinge module. The hinge module includes a latch is disposed in the second body, a shaft member positioned in the latch, a torsion member disposed in the first body to move along with the first body and pivotally connected to the shaft member, and a screw member penetrating through a side surface of the second body from outside the second body and extending inside the second body to lock the latch and the shaft member together. A friction force generated by a relative pivoting of the torsion member and the shaft member forms a torsion force of the hinge module. Part of the screw member is exposed on the side surface of the second body.

Based on the above, the hinge module of the foldable electronic device includes a latch, a shaft member, a torsion member, and a screw member. The latch is disposed in the second body. The shaft member is positioned in the latch and is pivotally connected to the torsion member. The screw member penetrates through the side surface of the second body from outside the second body and extends inside the second body to lock the latch and the shaft member together. Part of the screw member is exposed on the side surface of the second body.

In this way, the latch and the shaft member can be locked together or unlocked through the screw member such that the first body and the second body can be assembled or disassembled. More importantly, part of the screw member is exposed on the side surface of the second body, and penetrates through the side surface of the second body and extends inside the second body. Therefore, it means that the user can directly disassemble the screw member from the outer side surface of the second body, thereby achieving the aforementioned effect of separating the first body from the second body. Accordingly, the foldable electronic device of the disclosure has the characteristic of being easily disassembled and assembled due to the above-mentioned components, thereby improving the repair (regeneration) capability of the foldable electronic device and thus meeting the ESG evaluation conditions.

BRIEF DESCRIPTION OF THE DRAWINGS

FIG. 2 is an exploded view of the foldable electronic device of FIG. 1A.

DESCRIPTION OF THE EMBODIMENTS

Figure 1A:
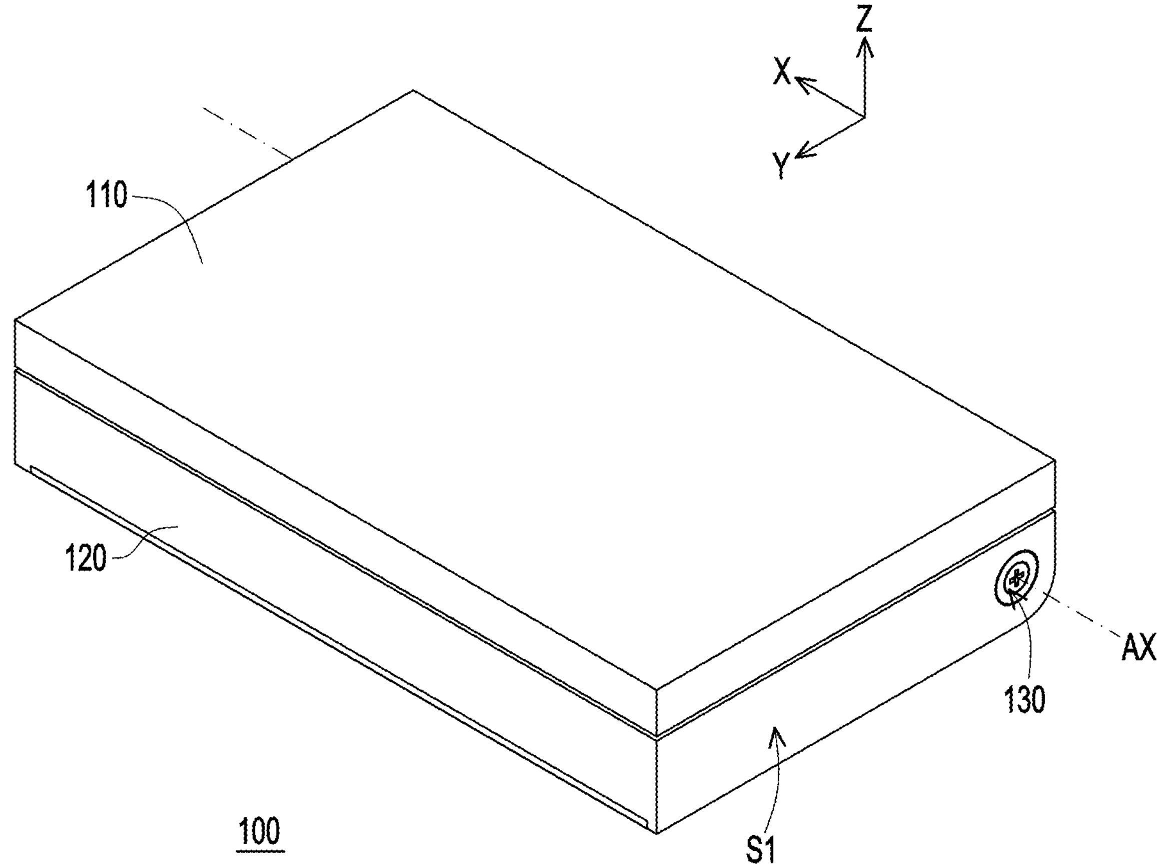
FIG. 1A is a schematic diagram of a foldable electronic device according to an embodiment of the disclosure.
Figure 1B:
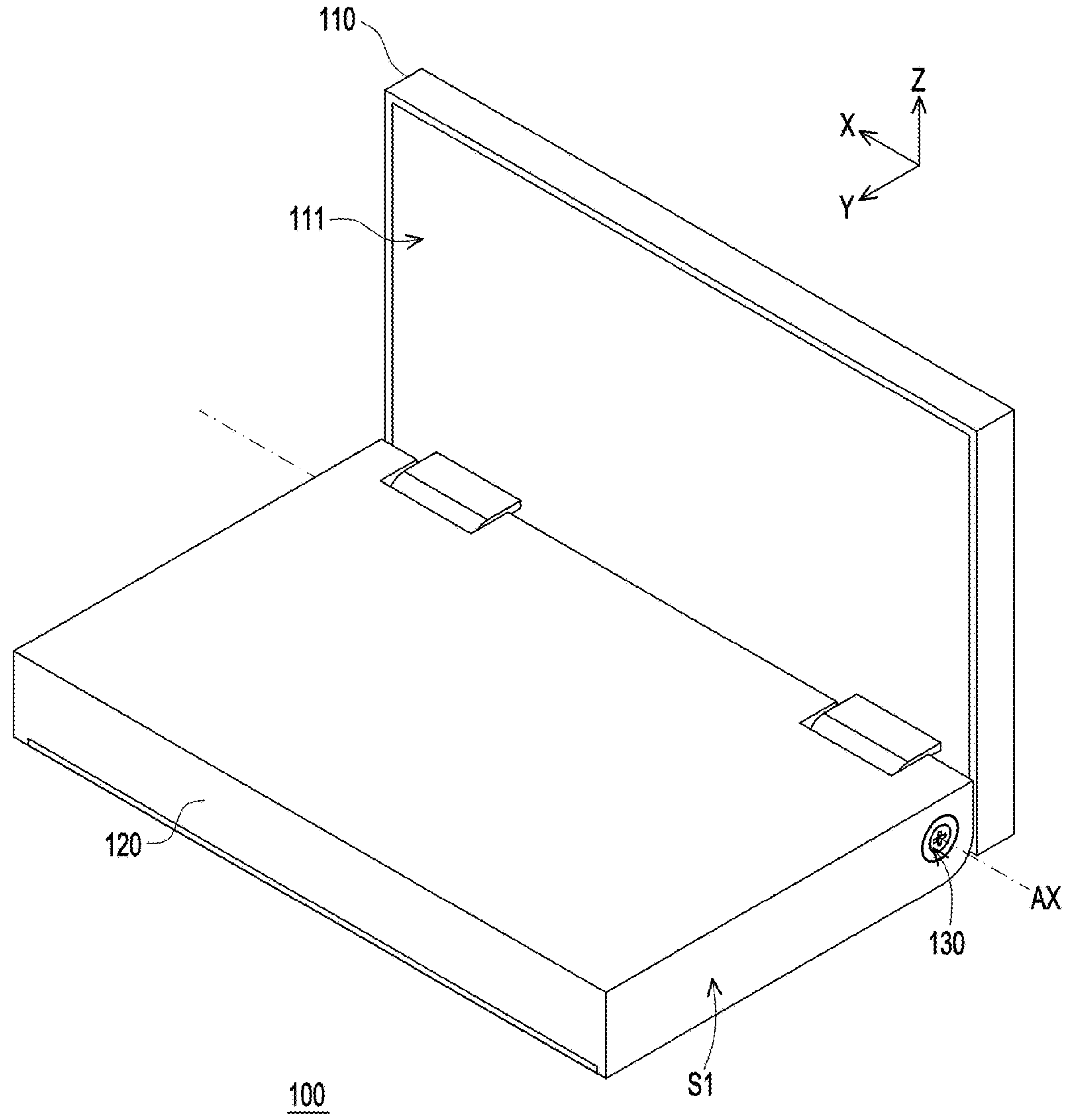
FIG. 1B is a schematic diagram of the foldable electronic device of FIG. 1A in another state.
Figure 1C:
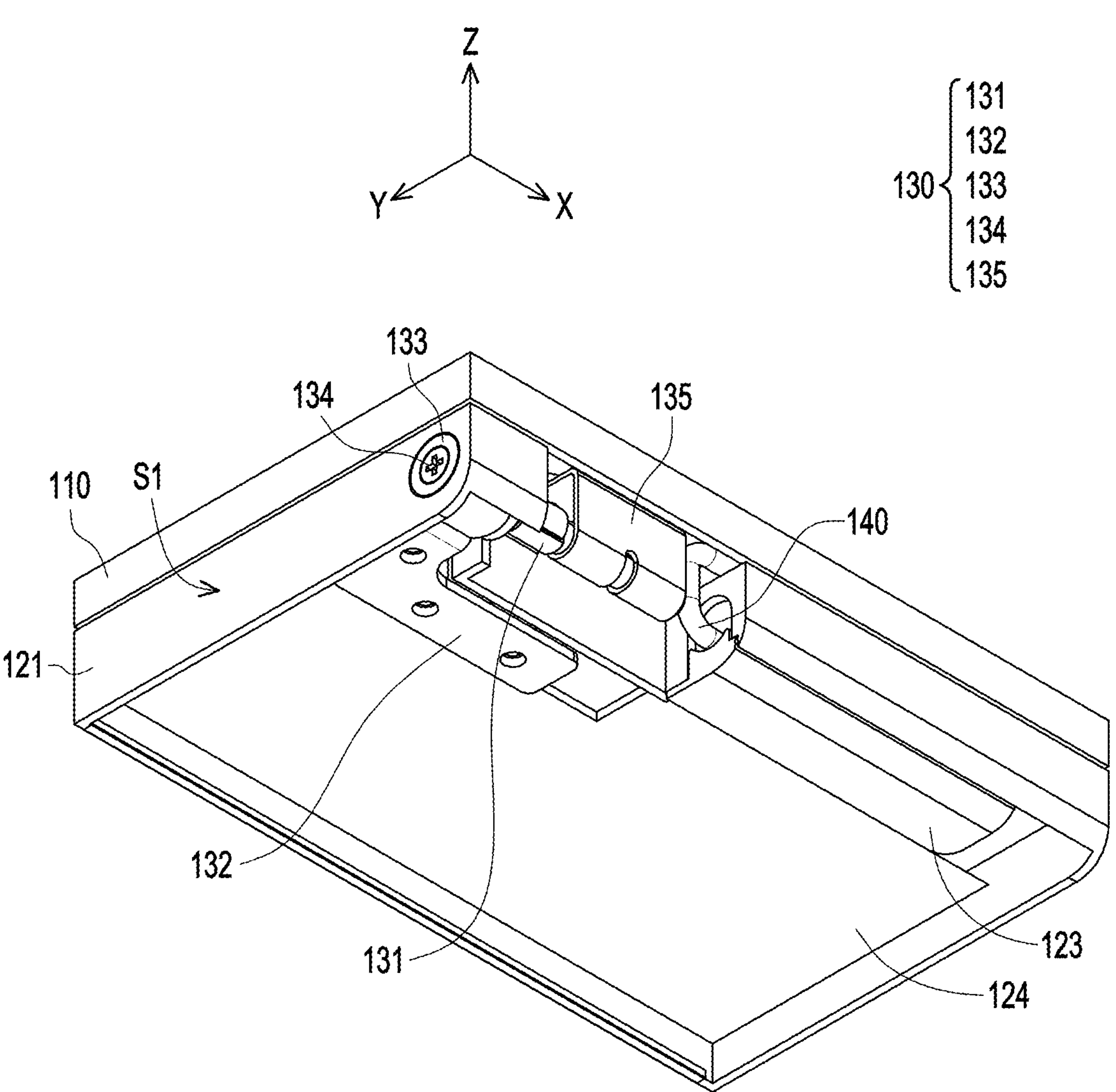
FIG. 1C illustrates part of the foldable electronic device of FIG. 1A from another viewing angle.
Figure 2:
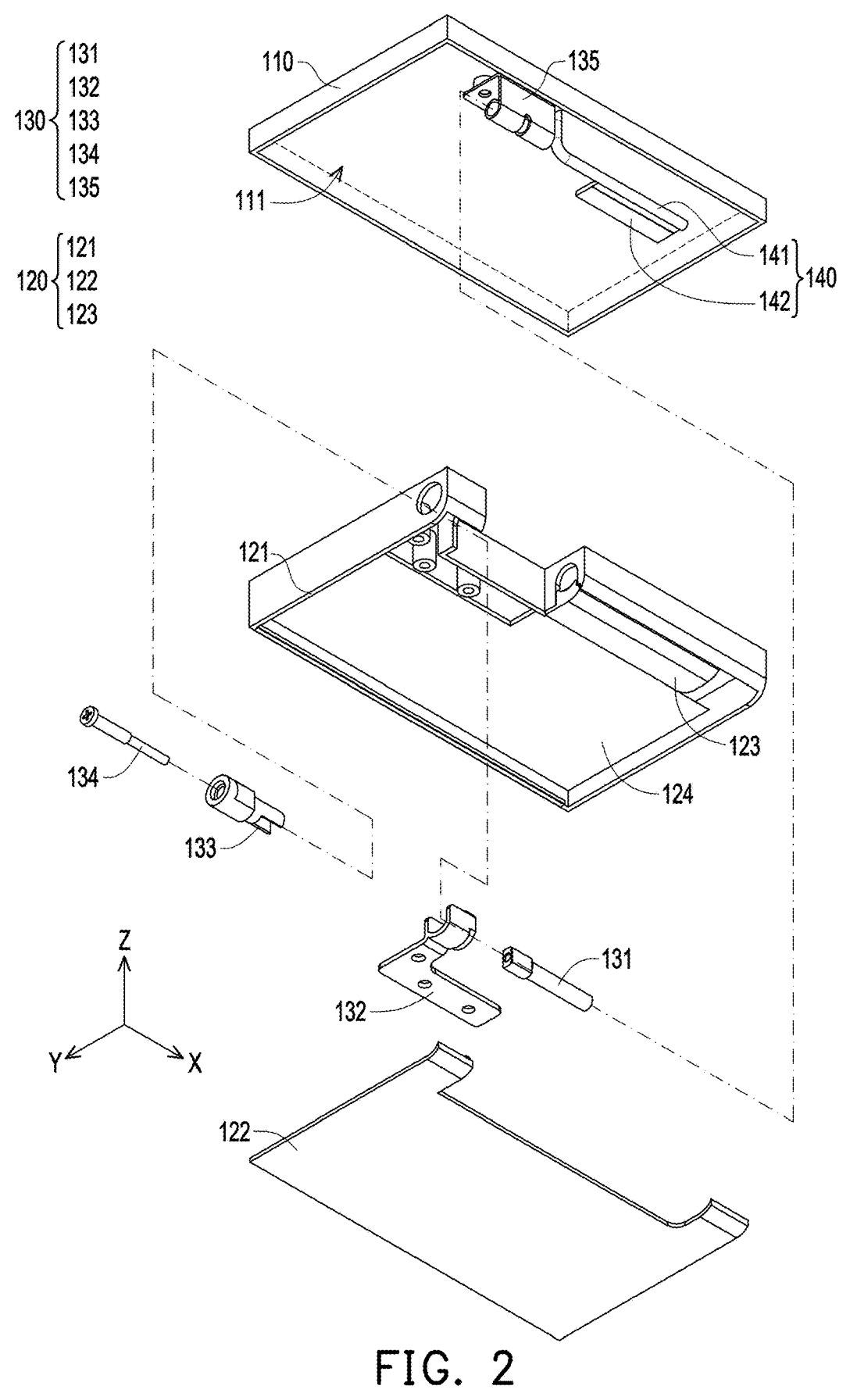

FIG. 1A is a schematic diagram of a foldable electronic device according to an embodiment of the disclosure. FIG. 1B is a schematic diagram of the foldable electronic device of FIG. 1A in another state. FIG. 1C illustrates part of the foldable electronic device of FIG. 1A from another viewing angle. At the same time, rectangular coordinates XYZ are provided to facilitate component description. Please refer to FIG. 1A, FIG. 1B, and FIG. 1C at the same time. In the embodiment, a foldable electronic device 100, such as a notebook computer or other related electronic devices with a foldable body, includes a first body 110, a second body 120, and a hinge module 130. The hinge module 130 connects the first body 110 and the second body 120 along a pivoting axis AX such that the first body 110 and the second body 120 relatively rotate to be folded or unfolded along the pivoting axis AX via the hinge module 130, as shown in FIG. 1 and FIG. 2. In the embodiment, the second body 120 is located on an XY plane as a reference to facilitate subsequent component description, and the pivoting axis AX is parallel to the X-axis.

Figure 3A:
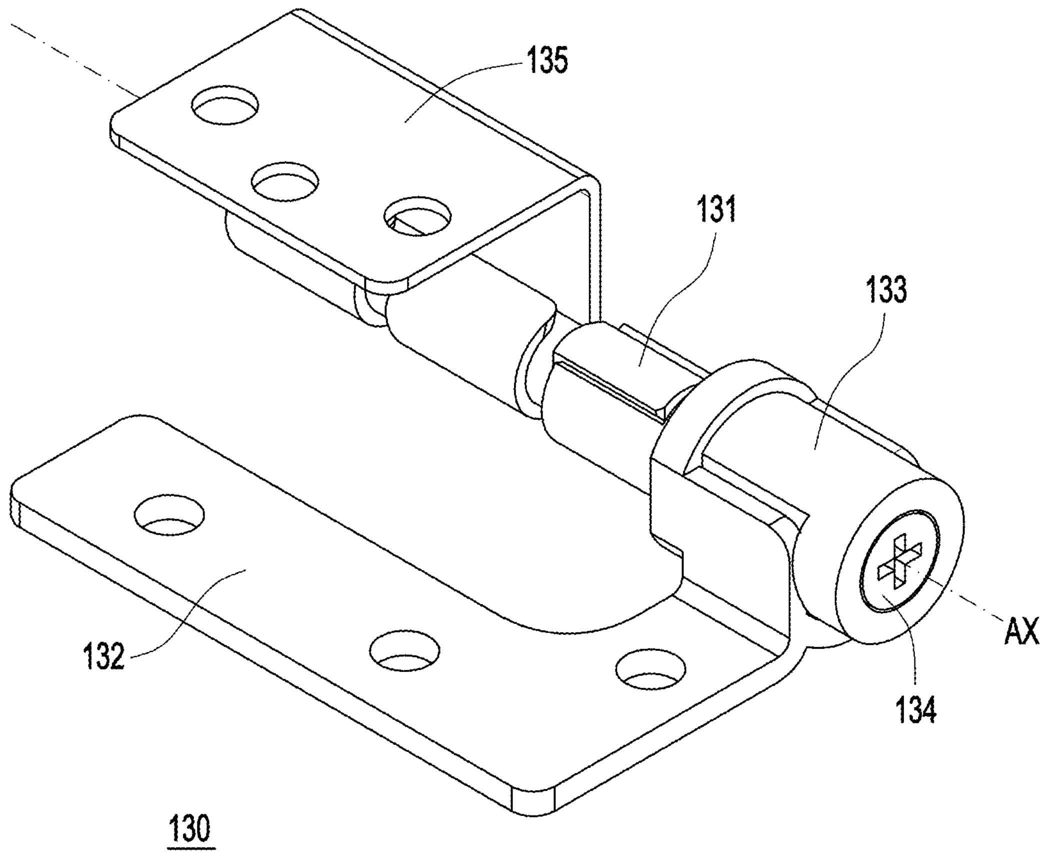
FIG. 3A is a schematic diagram of the hinge module of the foldable electronic device of FIG. 1A.
Figure 3B:
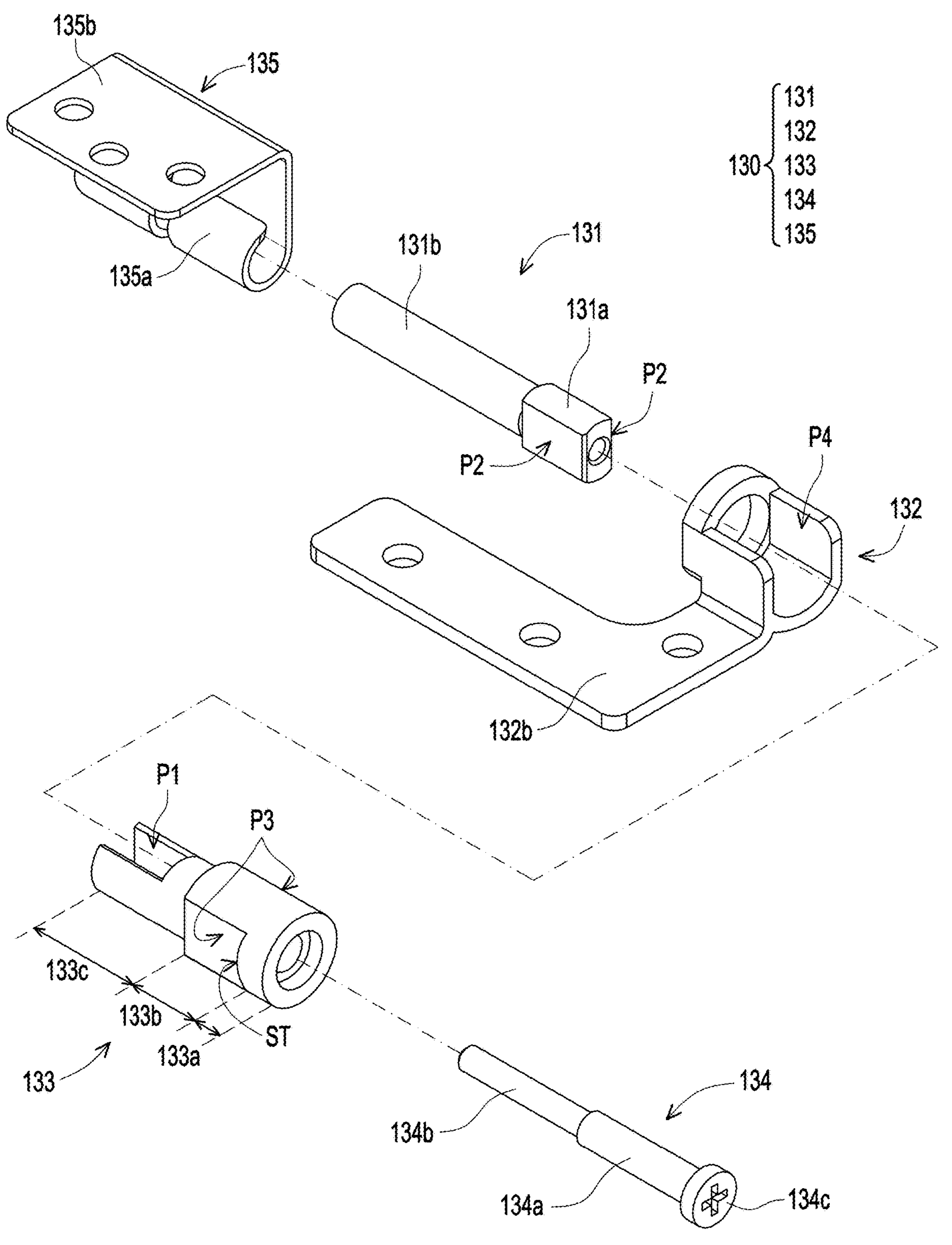
FIG. 3B is an exploded view of the hinge module of FIG. 3A.

FIG. 2 is an exploded view of the foldable electronic device of FIG. 1A, which inherits the viewing angle shown in FIG. 1C. FIG. 3A is a schematic diagram of the hinge module of the foldable electronic device of FIG. 1A. FIG. 3B is an exploded view of the hinge module of FIG. 3A. Please refer to FIG. 2, FIG. 3A, and FIG. 3B at the same time. In the embodiment, the hinge module 130 includes a latch 133, a shaft member 131, a torsion member 135, and a screw member 134. The latch 133 is disposed in the second body 120. The shaft member 131 is positioned in the latch 133. The screw member 134 penetrates through a side surface S1 of the second body 120 from outside the second body 120 and extends inside the second body 120 to lock the latch 133 and the shaft member 131 together. The torsion member 135 is disposed in the first body 110 to move along with the first body 110. The torsion member 135 is pivotally connected to the shaft member 131. The friction force generated by the relative pivoting of the torsion member 135 and the shaft member 131 forms the torsion force of the hinge module 130. Part of the screw member 134 is exposed on the side surface S1 of the second body 120.

Please refer to FIG. 3A and FIG. 3B at the same time. Specifically, the torsion member 135 of the hinge module 130 has an assembly portion 135*b* and a torsion portion 135*a*. The assembly portion 135*b* is configured to be assembled to the first body 110, and the torsion portion 135*a* is a different part of the same metal plate as the assembly portion 135*b*, and the metal plate is rolled into a spring structure to form the torsion portion 135*a*. The latch 133 is a cylindrical body and is further divided into a first section 133*a*, a second section 133*b*, and a third section 133*c* that are coaxial with each other (coaxial with the pivoting axis AX). The second section 133*b* is adjacent between the first section 133*a* and the third section 133*c*. The third section 133*c* of the latch 133 has a first limiting portion P1, and the second section 133*b* of the latch 133 has a third limiting portion P3. Correspondingly, the shaft member 131 has a limiting section 131*a* and a torsion section 131*b* that are coaxial with each other (coaxial with the pivoting axis AX). The limiting section 131*a* has a second limiting portion P2. The hinge module 130 also includes a base 132, which has an assembly portion 132*b* and a fourth limiting portion P4. The base 132 is assembled to the second body 120 through the assembly portion 132*b*.

Accordingly, based on the structural features of the aforementioned shaft member 131, base 132, latch 133, and torsion member 135, their assembly and corresponding relationships can be further understood. Here, as shown in FIG. 2, the latch 133 penetrates through the side surface S1 from outside the second body 120 and extends inside the second body 120 such that the third section 133*c* of the latch 133 penetrating through the base 132 is coupled to the shaft 131 and limit each other. The first limiting portion P1 of the latch 133 and the second limiting portion P2 of the shaft member 131 are fitted to each other and limit each other. At the same time, the second section 133*b* of the latch 133 falls into a groove structure of the base 132 to be fitted to each other such that the third limiting portion P3 of the latch 133 and the fourth limiting portion P4 of the base 132 are fitted to each other and limit each other. In this way, the shaft member 131, the base 132, and the latch 133 can limit each other and reduce their movement dimensions.

Here, the first limiting portion P1 is a limiting groove, and the second limiting portion P2 is a limiting block. Therefore, a groove wall of the limiting groove and an outer wall of the limiting block abut each other to produce a limiting effect. Similarly, the third limiting portion P3 is a limiting block, and the fourth limiting portion P4 is a limiting groove, so the same limiting effect can also be produced. It should also be mentioned that, on the premise that the above corresponding relationship is met to produce the limiting effect, in other embodiments not shown, the second limiting portion may also be changed into a limiting groove, so that the corresponding first limiting portion may be a limiting block. The third limiting portion may be a limiting groove, so that the corresponding fourth limiting portion may be a limiting block.

In addition, there is a step difference ST between the first section 133*a* and the second section 133*b* of the latch 133, so that when the second section 133*b* is fitted into the limiting groove (i.e., the fourth limiting portion P4) of the base 132, the step difference ST will be locked onto a side wall of the limiting groove to prevent the latch 133 from falling into the second body 120, as shown in FIG. 1C and FIG. 3A. Due to the step difference ST, the first section 133*a* of the latch 133 is partially exposed on the side surface S1 of the second body 120.

On the other hand, as shown in FIG. 2, FIG. 3A, and FIG. 3B, the torsion portion 135*a* of the torsion member 135 is pivotally connected to the torsion section 131*b* of the shaft member 131, so that under the influence of the elastic force of the torsion portion 135*a*, the torsion member 135 is disposed in the first body 110 to move along with the first body 110. Therefore, the friction force generated by the relative pivoting of the torsion member 135 and the shaft member 131 forms the torsion force of the hinge module 130.

Based on the corresponding assembly relationship of the aforementioned components, that is, the torsion member 135, the shaft member 131, the base 132, and the latch 133, the components already have a position-limiting relationship with each other, but still retain the ability to move along the axial direction of the pivoting axis AX. Therefore, it is necessary to use the screw member 134 of the hinge module 130 to correspond to the aforementioned components to achieve a further latching and fixing relationship. In the embodiment, the screw member 134 is, for example, a screw, and has a fourth section 134*a* and a fifth section 134*b*, and the threads on the surface are omitted here. As shown in FIG. 2, the screw member 134 is configured to penetrate through the side surface S1 of the second body 120 from outside the second body 120 and extend inside the second body 120. The screw member 134 penetrates through the latch 133 from the first section 133*a* of the latch 133, and penetrates out of the latch 133 from the third section 133*c*. Part of the screw member 134 that penetrates out of the third section 133*c* is locked into the limiting section 131*a* of the shaft member 131. In this way, the screw member 134 will lock the latch 133 and the shaft member 131 together.

As shown in FIG. 2, since the side surface S1 of the second body 120 is not covered by other components, a driving portion 134*c* of the screw member 134 and part of the latch 133 in the first section 133*a* are exposed from the side surface S1. That is to say, when the user removes the screw member 134 and the latch 133, it is equivalent to releasing the connection between the hinge module 130 and the first body 110 and the second body 120, thereby allowing the first body 110 and the second body 120 to be separated smoothly.

Figure 4A:
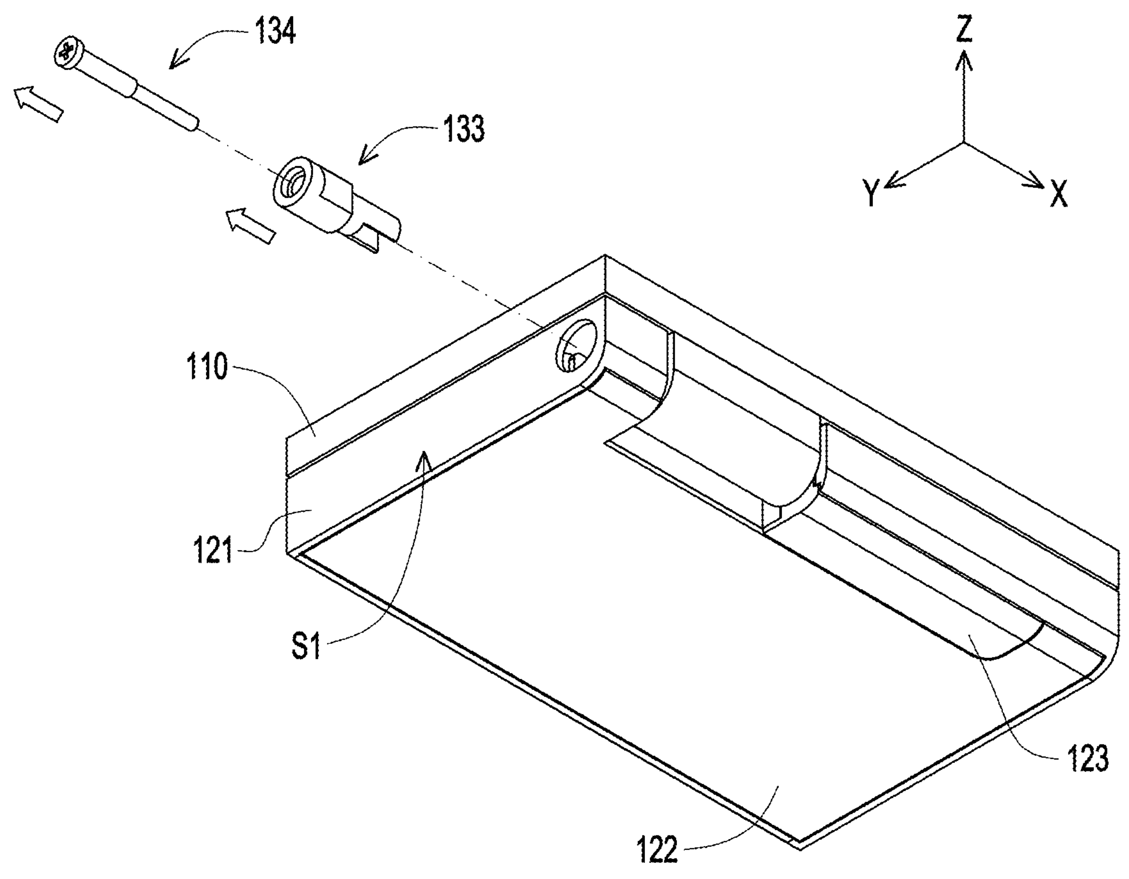
FIG. 4A to FIG. 4C are schematic views of disassembling components of the foldable electronic device.
Figure 4B:
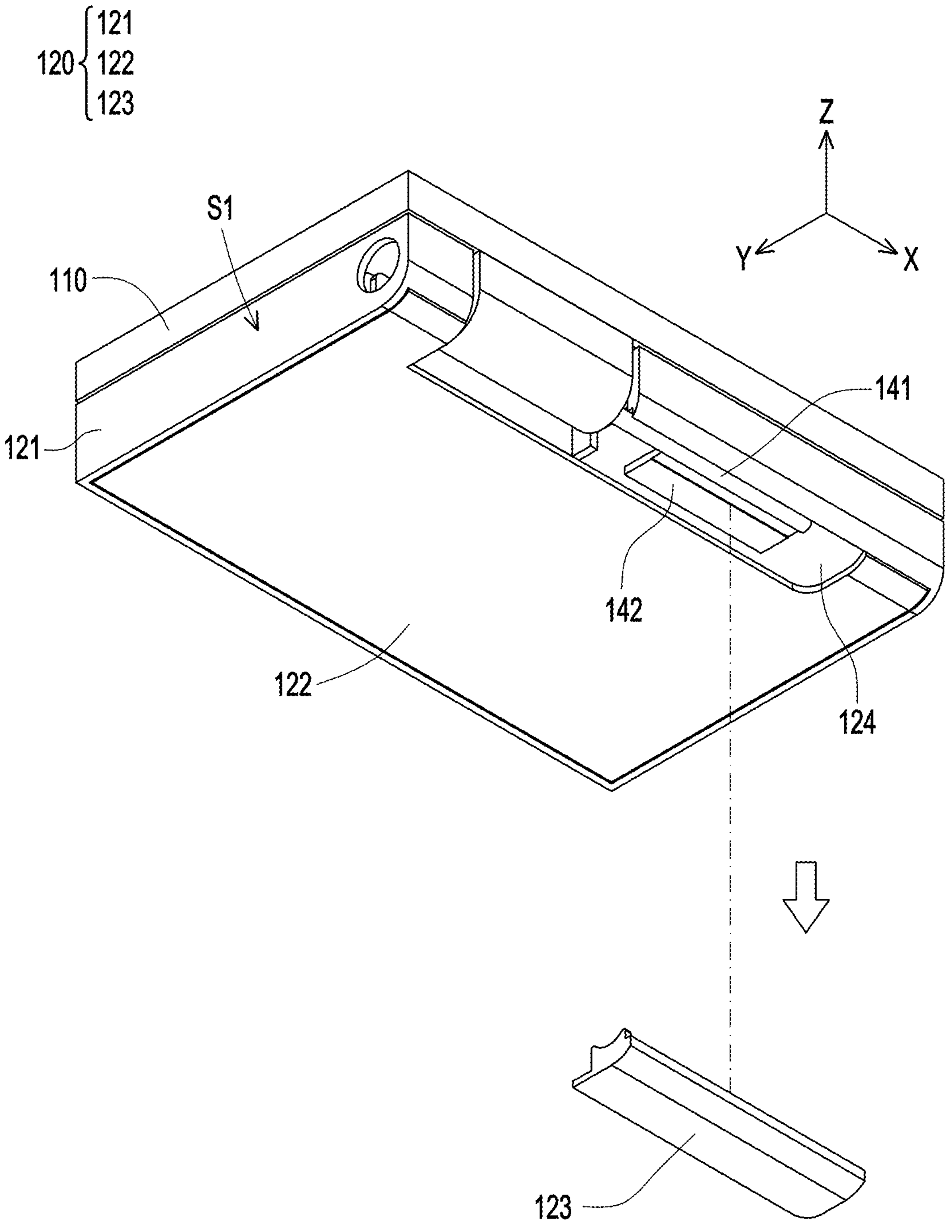
Figure 4C:
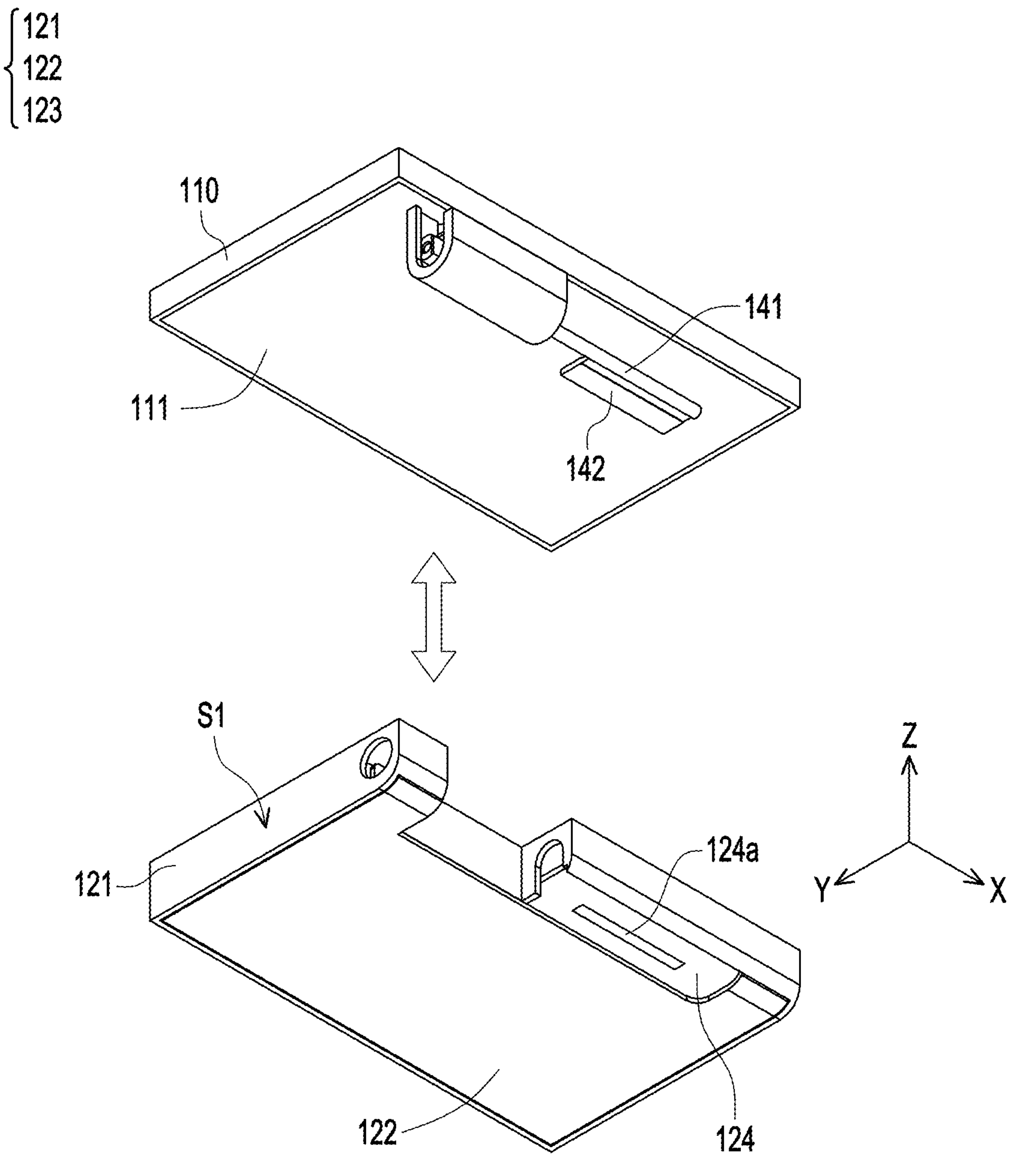

FIG. 4A to FIG. 4C are schematic views of disassembling components of the foldable electronic device. Please refer to FIG. 4A to FIG. 4C to clearly understand the disassembly process of the foldable electronic device 100. First, please refer to FIG. 4A and compare with FIG. 3B. Similar to FIG. 2, the screw member 134 and the latch 133 are sequentially separated from the side surface S1 of the second body 120. At this time, the shaft member 131 remaining in the second body 120 has lost the support of the latch 133 and can be separated from the base 132.

Next, please refer to FIG. 4B and compare with FIG. 2. The foldable electronic device 100 of the embodiment also includes a cable assembly 140, which consists of a cable 141 and a connector 142 to be electrically connected between a display module 111 of the first body 110 and a motherboard module 124 of the second body 120. One end of the cable 141 is electrically connected to the display module 111. The connector 142 is located at another end of the cable 141 and connected to the motherboard module 124, and the cable 141 passes beside the hinge module 130. As shown in FIG. 4B, the second body 120 can be further divided into a main body (consisting of side plates 121 and a bottom plate 122) and a flip cover 123. The flip cover 123 is assembled to the bottom plate 122 of the main body to cover the docking point between the connector 142 and the motherboard module 124 (here, the connector 142 of the cable assembly 140 is configured to dock with a connection portion 124*a* of the motherboard module 124). Conversely, when the flip cover 123 is disassembled from the bottom plate 122 of the main body, the motherboard module 124 and its docking point with the connector 142 will be exposed. Thus, in the process of FIG. 4B, the flip cover 123 is first disassembled from the main body, and then the connector 142 of the cable assembly 140 is disassembled from the motherboard module 124. At this point, the first body 110 and its display module 111 can be regarded as completely released from the assembly constraint relationship with the second body 120 and its motherboard module 124.

Finally, as shown in FIG. 4C, after the user pulls out the cable 141 and the connector 142 that have been separated from the motherboard module 124 from the second body 120, the first body 110 can be moved away from the second body 120 to complete the required disassembly operation.

To sum up, in the above embodiments of the disclosure, the hinge module of the foldable electronic device includes the latch, the shaft member, the torsion member, the base, and the screw member. The torsion member is disposed in the first body. The latch is disposed in the second body along with the base. The shaft member is positioned in the latch. The screw member penetrates through the side surface of the second body from outside the second body and extends inside the second body to lock the latch and the shaft together. Part of the screw member is exposed on the side surface of the second body. The torsion member is pivotally connected to the shaft member and moves along with the first body.

Furthermore, the screw member and the latch are assembled by penetrating through the side surface of the second body, and the side surface of the second body is exposed to the outside and not shielded by components. Therefore, the user can clearly understand and directly disassemble and assemble the screw member and the latch relative to the second body. In this way, the latch and the shaft member are provided or released through the screw member, so that the first body and the second body can be assembled or disassembled.

Accordingly, the foldable electronic device of the disclosure has the characteristics of easy disassembly and assembly due to the above-mentioned components, that is, complicated and difficult disassembly and assembly processes are avoided to allow the user to clearly recognize the location of the key components (the screw member and the latch), thereby improving the repair (regeneration) capability of the foldable electronic device and thus meeting the ESG evaluation conditions.

What is claimed is:

1. A foldable electronic device, comprising:

a first body;

a second body; and a hinge module, connecting the first body and the second body along a pivoting axis such that the first body and the second body relatively rotate to be folded or unfolded via the hinge module, wherein the hinge module comprises a latch, a shaft member, a torsion member, and a screw member, the latch is disposed in the second body, the shaft member is positioned in the latch, the screw member penetrates through a side surface of the second body from outside the second body and extends inside the second body to lock the latch and the shaft member together, the torsion member is disposed in the first body to move along with the first body, the torsion member is pivotally connected to the shaft member, and a friction force generated by a relative pivoting of the torsion member and the shaft member forms a torsion force of the hinge module, wherein part of the screw member is exposed on the side surface of the second body, wherein the side surface is an outer surface of the second body, exposed to the outside, and not shielded by components.

2. The foldable electronic device according to claim 1, wherein the latch penetrates through the side surface from outside the second body and extends inside the second body to be coupled to the shaft member and limit each other.

3. The foldable electronic device according to claim 2, wherein the latch has a first limiting portion, the shaft member has a second limiting portion, and the first limiting portion and the second limiting portion are fitted to each other.

4. The foldable electronic device according to claim 3, wherein one of the first limiting portion and the second limiting portion is a limiting groove, the other of the first limiting portion and the second limiting portion is a limiting block, and a groove wall of the limiting groove and an outer wall of the limiting block abut each other to limit.

5. The foldable electronic device according to claim 1, wherein the latch has a third limiting portion, the foldable electronic device also comprises a base disposed in the second body, the base has a fourth limiting portion, and the third limiting portion and the fourth limiting portion are fitted to each other.

6. The foldable electronic device according to claim 5, wherein one of the third limiting portion and the fourth limiting portion is a limiting groove, the other of the third limiting portion and the fourth limiting portion is a limiting block, and a groove wall of the limiting groove and an outer wall of the limiting block abut each other to limit.

7. The foldable electronic device according to claim 1, wherein the latch has a first section, a second section, and a third section that are coaxial with each other, the second section is connected between the first section and the third section, the shaft member has a limiting section and a torsion section that are coaxial with each other, the screw member penetrates through the latch from the first section and penetrates out of the latch from the third section, the limiting section is fitted to the third section, the torsion member is pivotally connected to the torsion section, and part of the screw member that penetrates out of the third section is locked into the limiting section.

8. The foldable electronic device according to claim 7, wherein there is a step difference between the first section and the second section, the foldable electronic device also comprises a base disposed in the second body, the base has a limiting groove, the second section is fitted into the limiting groove, and the step difference is locked onto a side wall of the limiting groove.

9. The foldable electronic device according to claim 1, wherein part of the latch is exposed from the side surface of the second body.

10. The foldable electronic device according to claim 1, further comprising a cable assembly electrically connected between a display module of the first body and a motherboard module of the second body, wherein the cable assembly passes beside the hinge module.

11. The foldable electronic device according to claim 10, wherein the cable assembly comprises a cable and a connector, one end of the cable is electrically connected to the display module, and the connector is located at another end of the cable and connected to the motherboard module.

12. The foldable electronic device according to claim 11, wherein the second body comprises a main body and a flip cover, and the flip cover is assembled to the main body to cover a docking point between the connector and the motherboard module, or the flip cover is disassembled from the main body to expose the docking point.

* * * * *